(12) United States Patent
Ben Shem

(10) Patent No.: US 11,798,960 B2
(45) Date of Patent: Oct. 24, 2023

(54) PROCESSING CIRCUIT AND METHOD FOR TIME-OF-FLIGHT IMAGE SENSOR

(71) Applicant: Sony Semiconductor Solutions Corporation, Kanagawa (JP)

(72) Inventor: Ariel Ben Shem, Hasharon (IL)

(73) Assignee: Sony Semiconductor Solutions Corporation, Kanagawa (JP)

(*) Notice: Subject to any disclaimer, the term of this patent is extended or adjusted under 35 U.S.C. 154(b) by 1260 days.

(21) Appl. No.: 16/352,074

(22) Filed: Mar. 13, 2019

(65) Prior Publication Data

US 2020/0295060 A1 Sep. 17, 2020

(51) Int. Cl.
| | |
|---|---|
| *H01L 27/146* | (2006.01) |
| *G01S 7/4865* | (2020.01) |
| *H04N 25/77* | (2023.01) |
| *G01S 7/483* | (2006.01) |
| *G01S 7/487* | (2006.01) |
| *G01S 17/18* | (2020.01) |
| *G01S 17/10* | (2020.01) |
| *G01S 17/32* | (2020.01) |

(52) U.S. Cl.
CPC ...... *H01L 27/14601* (2013.01); *G01S 7/4865* (2013.01); *G01S 17/10* (2013.01); *G01S 17/32* (2013.01); *H04N 25/77* (2023.01); *G01S 7/483* (2013.01); *G01S 7/487* (2013.01); *G01S 17/18* (2020.01); *H01L 27/146* (2013.01)

(58) Field of Classification Search
CPC ............. H01L 27/14601; H01L 27/146; G01S 7/4865; G01S 17/10; G01S 17/32; G01S 17/18; G01S 7/483; G01S 7/487; H04N 5/3745

See application file for complete search history.

(56) References Cited

U.S. PATENT DOCUMENTS

| | | | | |
|---|---|---|---|---|
| 6,967,688 | B1* | 11/2005 | Morrish | H04N 5/44504 348/E5.1 |
| 6,977,603 | B1* | 12/2005 | Barna | H04N 3/155 348/E3.018 |
| 2008/0043128 | A1* | 2/2008 | Poonnen | H04N 5/378 348/294 |
| 2014/0267859 | A1* | 9/2014 | Wang | H04N 5/3559 348/308 |
| 2016/0109562 | A1* | 4/2016 | Fowler | G01S 17/10 356/5.01 |
| 2016/0268331 | A1* | 9/2016 | Parmesan | H04N 5/37455 |
| 2017/0237891 | A1* | 8/2017 | De Coi | H01L 27/14603 348/231.99 |

(Continued)

*Primary Examiner* — Isam A Alsomiri
*Assistant Examiner* — Joseph C Fritchman
(74) *Attorney, Agent, or Firm* — Michael Best & Friedrich LLP

(57) ABSTRACT

A time-of-flight imaging device comprises an image sensor comprising a pixel array including a plurality of pixel circuits, respective ones of the plurality of pixel circuits including a first tap output configured to output a first tap signal, and a second tap output configured to output a second tap signal; and a signal processing circuit including a time-of-flight processing circuit configured to perform at least one logical operation on the first tap signal and the second tap signal based on a mode of the signal processing circuit, and a counter configured to output a digital signal based on an output of the time-of-flight processing circuit.

12 Claims, 10 Drawing Sheets

(56) References Cited

U.S. PATENT DOCUMENTS

| | | | |
|---|---|---|---|
| 2018/0059224 A1* | 3/2018 | Wang | G01S 17/10 |
| 2018/0295301 A1* | 10/2018 | Lee | H04N 25/60 |
| 2019/0267498 A1* | 8/2019 | Cheng | H01L 31/1812 |
| 2019/0383916 A1* | 12/2019 | Gutnik | G01S 7/4861 |
| 2019/0383946 A1* | 12/2019 | Namba | G01S 7/4808 |
| 2020/0111823 A1* | 4/2020 | Jin | G01S 17/894 |

* cited by examiner

PROCESSING CIRCUIT AND METHOD FOR TIME-OF-FLIGHT IMAGE SENSOR

BACKGROUND OF THE INVENTION

1. Field of the Invention

This application relates generally image sensors. More specifically, this application relates to a system and method for distance and depth determination in a time-of-flight image sensor.

2. Description of Related Art

Image sensing devices typically include an image sensor, generally implemented as an array of pixel circuits, as well as signal processing circuitry and any associated control or timing circuitry. Within the image sensor itself, charge is collected in a photoelectric conversion device of the pixel circuit as a result of the impingement of light. There are typically a very large number of individual photoelectric conversion devices (e.g. tens of millions), and many signal processing circuitry components working in parallel. Various components within the signal processing circuitry are shared by a large number of photoelectric conversion devices; for example, a column or multiple columns of photoelectric conversion devices may share a single analog-to-digital converter (ADC) or sample-and-hold (S/H) circuit.

In photography applications, the outputs of the pixel circuits are used to generate an image. In addition to photography, image sensors are used in a variety of applications which may utilize the collected charge for additional or alternative purposes. For example, in applications such as game machines, autonomous vehicles, telemetry systems, factory inspection, gesture controlled computer input devices, and the like, it may be desirable to detect the depth of various objects in a three-dimensional space.

Moreover, some image sensors support pixel binning operations. In binning, input pixel values from neighboring pixel circuits are averaged together with or without weights to produce an output pixel value. Binning results in a reduced resolution or pixel count in the output image, and may be utilized so as to permit the image sensor to operate effectively in low light conditions or with reduced power consumption One method for determining depths of points in a scene in an image sensor is time-of-flight (TOF) sensing. The TOF method utilizes an emitted light wave and a reflected light wave, and determines distance based on the relationship between these two light waves. In a direct time-of-flight (DTOF) method, distance may be determined based on the total travel time for the emitted and reflected light waves. In an indirect (ITOF) method, distance may be determined based on a phase shift of the reflected light wave as compared to the emitted light wave, which has a periodic waveform. In some implementations, ITOF sensors may require complex processing circuits to implement various modes, such as pixel binning, and to perform various calculations relating to the distance determination. These circuits may result in increased power consumption and/or increased area required.

Accordingly, there exists a need for a distance determination system and method in an ITOF image sensor that consumes minimal power, occupies a decreased area, and supports several operating modes. Furthermore, there exists a need for a distance determination system and method in an ITOF image sensor that is compatible with existing image sensor designs, without a great deal of redesign.

BRIEF SUMMARY OF THE INVENTION

Various aspects of the present disclosure relate to an image sensor and distance determination method therein.

In one aspect of the present disclosure, a time-of-flight imaging device is provided. The time-of-flight imaging device comprises an image sensor comprising a pixel array including a plurality of pixel circuits, respective ones of the plurality of pixel circuits including a first tap output configured to output a first tap signal, and a second tap output configured to output a second tap signal; and a signal processing circuit including a time-of-flight processing circuit configured to perform at least one logical operation on the first tap signal and the second tap signal based on a mode of the signal processing circuit, and a counter configured to output a digital signal based on an output of the time-of-flight processing circuit.

In another aspect of the present disclosure, a method of operating a time-of-flight imaging device comprising an image sensor comprising a pixel array including a plurality of pixel circuits, respective ones of the plurality of pixel circuits including a first tap output and a second tap output, and a signal processing circuit is provided. The method comprises outputting, by the first tap output, a first tap signal; outputting, by the second tap output, a second tap signal; performing, by a time-of-flight processing circuit of the signal processing circuit, at least one logical operation on the first tap output and the second tap output based on a mode of the signal processing circuit; and outputting, by a counter of the signal processing circuit, a digital signal based on an output of the time-of-flight processing circuit In this manner, the above aspects of the present disclosure provide for improvements in at least the technical field of depth sensing, as well as the related technical fields of imaging, image processing, and the like.

This disclosure can be embodied in various forms, including hardware or circuits controlled by computer-implemented methods, computer program products, computer systems and networks, user interfaces, and application programming interfaces; as well as hardware-implemented methods, signal processing circuits, image sensor circuits, application specific integrated circuits, field programmable gate arrays, and the like. The foregoing summary is intended solely to give a general idea of various aspects of the present disclosure, and does not limit the scope of the disclosure in any way.

DESCRIPTION OF THE DRAWINGS

These and other more detailed and specific features of various embodiments are more fully disclosed in the following description, reference being had to the accompanying drawings, in which.

DETAILED DESCRIPTION

In the following description, numerous details are set forth, such as flowcharts, data tables, and system configurations. It will be readily apparent to one skilled in the art that these specific details are merely exemplary and not intended to limit the scope of this application.

Moreover, while the present disclosure focuses mainly on examples in which the processing circuits are used in image sensors, it will be understood that this is merely one example of an implementation. It will further be understood that the disclosed systems and methods can be used in any device in which there is a need to detect distance in a wave-based sensor; for example, an audio circuit, phononic sensor, a radar system, and the like.

Imaging System

Figure 1:
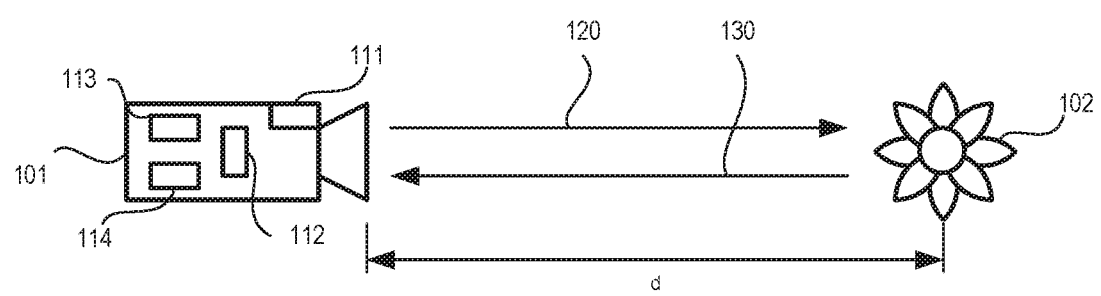
FIG. 1 illustrates an exemplary TOF imaging system according to various aspects of the present disclosure.

FIG. 1 illustrates a TOF imaging system 101 configured to image an object 102 located a distance d away. The TOF imaging system 101 includes a light generator 111 configured to generate an emitted light wave 120 toward the object 102 and an image sensor 112 configured to receive a reflected light wave 130 from the object 102. The emitted light wave 120 may have a periodic waveform. The image sensor 112 may be any device capable of converting incident radiation into signals. For example the image sensor may be a Complementary Metal-Oxide Semiconductor (CMOS) Image Sensor (CIS), a Charge-Coupled Device (CCD), and the like. The TOF imaging system 101 may further include distance determination circuitry such as a controller 113 (e.g., a CPU) and a memory 114, which may operate to perform one or more examples of time-of-flight processing as described further below.

The light generator 111 may be, for example, a light emitting diode (LED), a laser diode, or any other light generating device or combination of devices, and the light waveform may be controlled by the controller 113. The light generator may operate in the infrared range so as to reduce interference from the visible spectrum of light, although any wavelength range perceivable by the image sensor 112 may be utilized. The controller 113 may be configured to receive an image from the image sensor and calculate a depth map indicative of the distance d to various points of the object 102.

Figure 2:
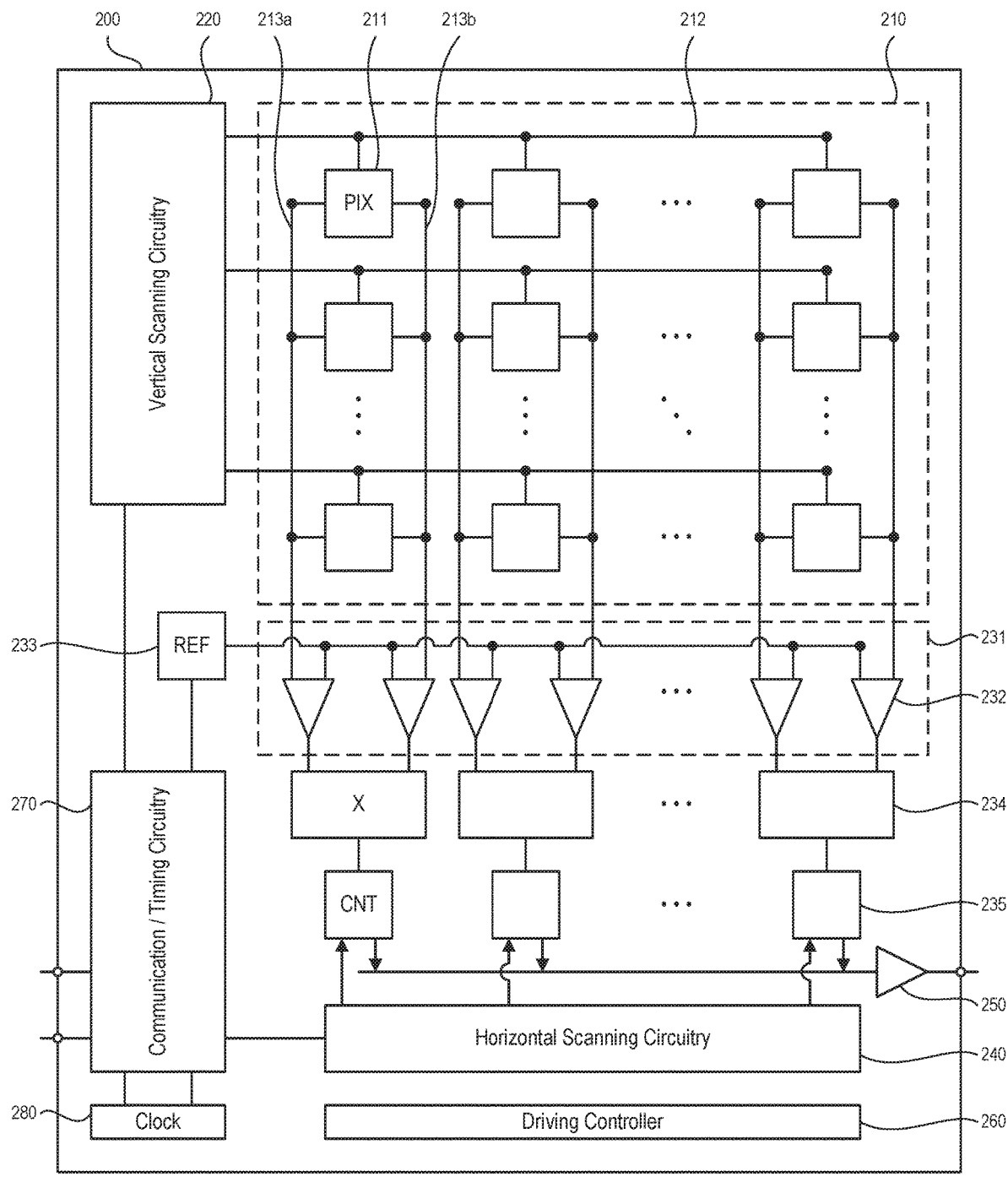
FIG. 2 illustrates an exemplary image sensor according to various aspects of the present disclosure.

FIG. 2 illustrates an exemplary image sensor 200 according to various aspects of the present disclosure. The image sensor 200 may be an example of the image sensor 112 illustrated in FIG. 1. As illustrated in FIG. 2, the image sensor 200 includes an array 210 of pixel circuits 211, each of which are located at an intersection where a horizontal signal line 212 and a pair of vertical signal lines 213a and 213b cross each other. The horizontal signal lines 212 are operatively connected to vertical scanning circuitry 220, also referred to as a "row scanning circuit" or a "vertical driving circuit," at a point outside of the pixel array 210. The horizontal signal lines 212 carry signals from the vertical scanning circuitry 220 to a particular row of the pixel circuits 211. While FIG. 2 illustrates a single horizontal signal line 212 for a given row of the pixel circuits 211, in practice a plurality of the horizontal signal lines 212 may be provided for each row of the pixel circuits 211.

Figure 3:
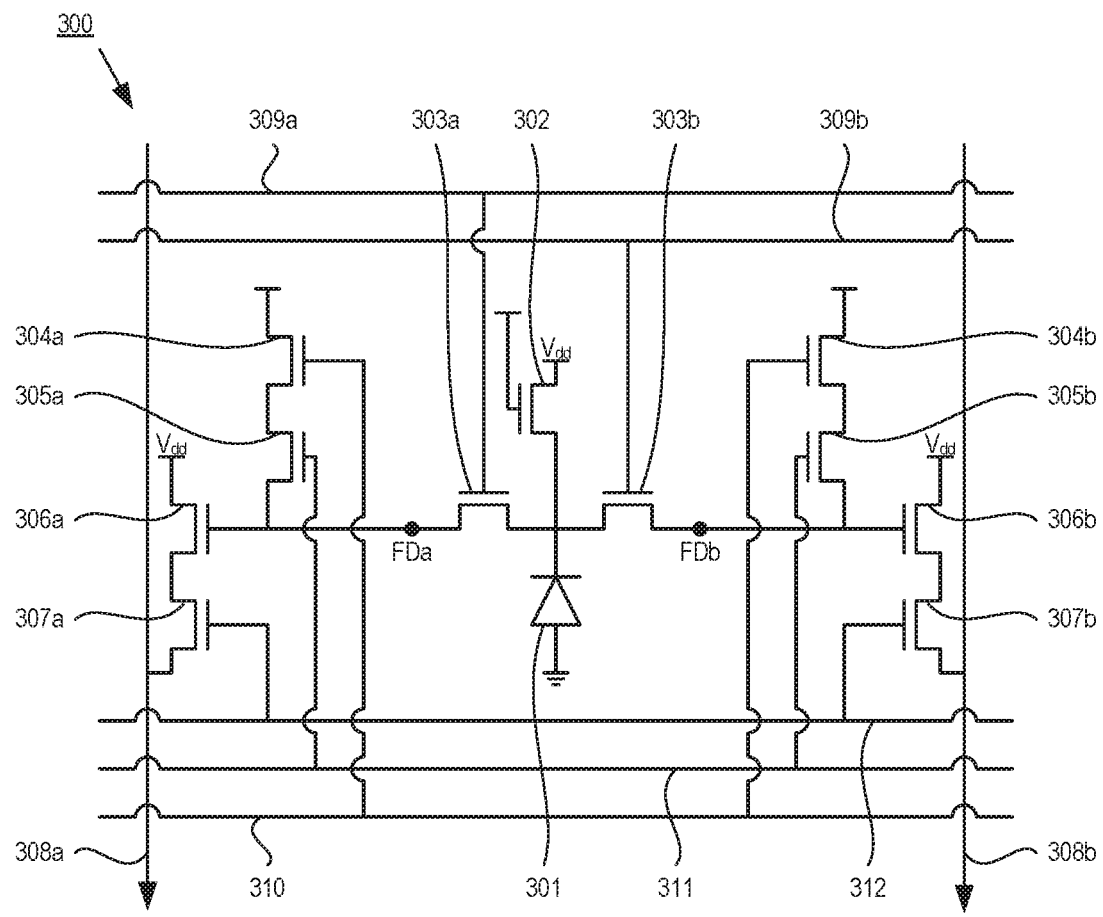
FIG. 3 illustrates an exemplary pixel circuit according to various aspects of the present disclosure.

The pixel circuits 211 store a charge corresponding to an amount of incident light alternately in floating diffusions FDa and FDb (for example, as illustrated in FIG. 3) and selectively output an analog signal corresponding to an amount of the charge to the vertical signal lines 213a and 213b in a manner that will be described in more detail below. While FIG. 2 illustrates the vertical signal lines 213a and 213b for a given pixel circuit 211 on opposite sides thereof, in practice the vertical signal lines 213a and 213b may both be provided on a single side of the given pixel circuit 211. Furthermore, for illustration purposes, only a subset of the pixel circuits 211 in the array 210 are actually shown in FIG. 2; however, in practice the image sensor 200 may have any number of the pixel circuits 211. FIG. 2 illustrates two vertical signal lines 213a and 213b for each column of the pixel circuits 211 (a "two-tap" system); however, in practice the image sensor 200 may incorporate a larger number of the vertical signal lines for each column of the pixel circuits 211.

The vertical signal lines 213a and 213b conduct the analog signals (A and B, respectively) for a particular column to a comparator circuit 231, which includes a comparator 232 for each vertical signal line. Each comparator 232 compares an analog signal to a reference signal output from a reference signal generator 233. The reference signal generator 233 may be, for example, a digital-to-analog converter (DAC) and the reference signal may have, for example, a periodic ramp waveform. Each comparator 232 outputs a digital signal indicative of a comparison between the input analog signal from the corresponding vertical signal line and the reference signal. For each column of the pixel circuits 211, a pair of the comparators 232 output corresponding digital signals to a TOF processing circuit 234. The TOF processing circuit 234 performs various operations on the digital signals and outputs a determination signal to a counter 235. Compared with other implementations that require a counter for each tap, the image sensor 200 preferably utilizes one counter 235 for each pixel column.

Collectively, the comparator circuit 231, the TOF processing circuit 234, and the counter 235 may be referred to as a "signal processing circuit." The signal processing circuit may include additional components, such as latches, S/H circuits, and the like. The signal processing circuit may be capable of performing a method of correlated double sampling (CDS). CDS is capable of overcoming some pixel noise related issues by sampling each pixel circuit 211 twice. First, the reset voltage $V_{reset}$ of a pixel circuit 211 is sampled. This may also be referred to as the P-phase value or cds value. Subsequently, the data voltage $V_{data}$ of the pixel circuit 211 (that is, the voltage after the pixel circuit 211 has been exposed to light) is sampled. This may also be referred to as the D-phase value or light-exposed value. The reset value $V_{reset}$ is then subtracted from the data value $V_{data}$ to provide a value which reflects the amount of light falling on the pixel circuit 211. The CDS method may be performed for each tap of the pixel circuit 211.

Various components of the signal processing circuit are controlled by horizontal scanning circuitry 240, also known as a "column scanning circuit" or "horizontal driving circuit." The horizontal scanning circuitry 240 causes the signal processing circuit to output signals via an output circuit 250 for further processing, storage, transmission, and the like. The vertical scanning circuitry 220, the reference circuit generator 233, and the horizontal circuitry 240 may operate under the control of a driving controller 260 and/or communication and timing circuitry 270, which may in turn operate based on a clock circuit 280. The clock circuit 280 may be a clock generator, which generates one or more clock signals for various components of the image sensor 200. Additionally or alternatively, the clock circuit 280 may be a clock converter, which converts one or more clock signals received from outside the image sensor 200 and provides the converted clock signal(s) to various components of the image sensor 200.

FIG. 3 illustrates an exemplary pixel circuit 300 having a two-tap configuration. The pixel circuit 300 may be an example of the pixel circuit 211 illustrated in FIG. 2. As shown in FIG. 3, the pixel circuit 300 includes a photoelectric conversion device 301 (e.g., a photodiode), a pixel reset transistor 302, a first transfer transistor 303a, a second transfer transistor 303b, a first floating diffusion FDa, a second floating diffusion FDb, a first tap reset transistor 304a, a second tap reset transistor 304b, a first intervening transistor 305a, a second intervening transistor 305b, a first amplifier transistor 306a, a second amplifier transistor 306b, a first selection transistor 307a, and a second selection transistor 307b. The photoelectric conversion device 301, the first transfer transistor 303a, the first tap reset transistor 304a, the first intervening transistor 305a, the first amplifier transistor 306a, and the first selection transistor 307a are controlled to output an analog signal (A) via a first vertical signal line 308a, which may be an example of the vertical signal line 213a illustrated in FIG. 2. This set of components may be referred to as "Tap A." The photoelectric conversion device 301, the second transfer transistor 303b, the second tap reset transistor 304b, the second intervening transistor 305b, the second amplifier transistor 306b, and the second selection transistor 307b are controlled to output an analog signal (B) via a second vertical signal line 308b, which may be an example of the vertical signal line 213b illustrated in FIG. 2. This set of components may be referred to as "Tap B."

The first transfer transistor 303a and the second transfer transistor 303b are controlled by control signals on a first transfer gate line 309a and a second transfer gate line 309b, respectively. The first tap reset transistor 304a and the second tap reset transistor 304b are controlled by a control signal on a tap reset gate line 310. The first intervening transistor 305a and the second intervening transistor 305b are controlled by a control signal on a FD gate line 311. The first selection transistor 307a and the second selection transistor 307b are controlled by a control signal on a selection gate line 312. The first and second transfer gate lines 309a and 309b, the tap reset gate line 310, the FD gate line 311, and the selection gate line 312 may be examples of the horizontal signal lines 212 illustrated in FIG. 2.

In operation, the pixel circuit 300 is controlled in a time-divisional manner such that, during a first half of a horizontal period, incident light is converted via Tap A to generate the output signal A; and, during a second half of the horizontal period, incident light is converted via Tap B to generate the output signal B.

While FIG. 3 illustrates the pixel circuit 300 having a plurality of transistors in a particular configuration, the current disclosure is not so limited and may apply to a configuration in which the pixel circuit 300 includes fewer or more transistors as well as other elements, such as additional capacitors, resistors, and the like.

TOF Processing Circuit

In order to calculate the depth map (for example, as described above with regard to FIG. 1), it is not necessary to output the actual signals A and B from the image sensor 112 to the controller 113. Instead, it is possible to process each of these values and selectively generate various arithmetic combinations of the signals A and B. This processing is preferably performed in a processing circuit within the image sensor itself; for example, in the TOF processing circuit 234 illustrated in FIG. 2. Specifically, the TOF processing circuit 234 may be configured to receive signals A and B and selectively output one or more of a difference signal A−B, a combination signal A+B, a maximum signal Max(A,B), the signal A, or the signal B. One example of these outputs is illustrated in FIG. 4.

Figure 4:
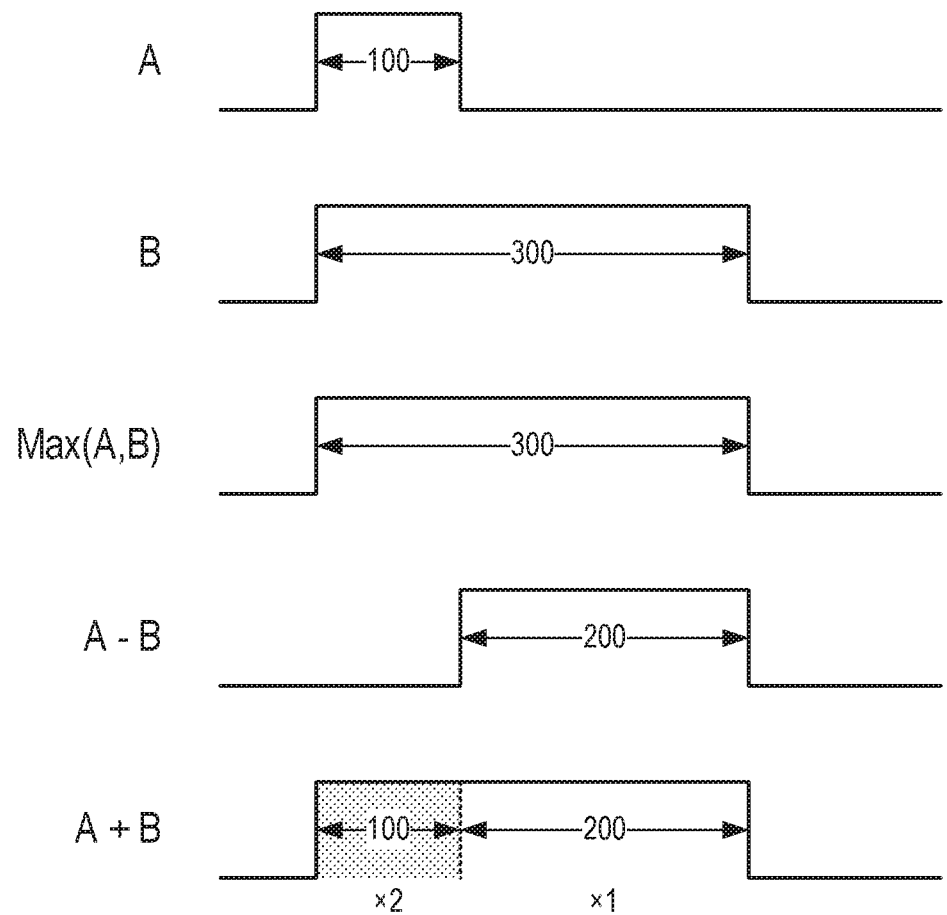
FIG. 4 illustrates a set of exemplary output waveforms according to various aspects of the present disclosure.

Specifically, FIG. 4 illustrates an exemplary set of output waveforms for the particular case in which the signal A has a digital value of 100 and the signal B has a digital value of 300. In such a case, the signal Max(A,B) is merely the greater of signals A and B (300), the signal A−B is represented by the period during which the signal B is high and the signal A is low (200), and the signal A+B is represented by double the period during which both the signals A and B are high plus the period during which the signal B is high and the signal A is low (400).

Figure 5A:
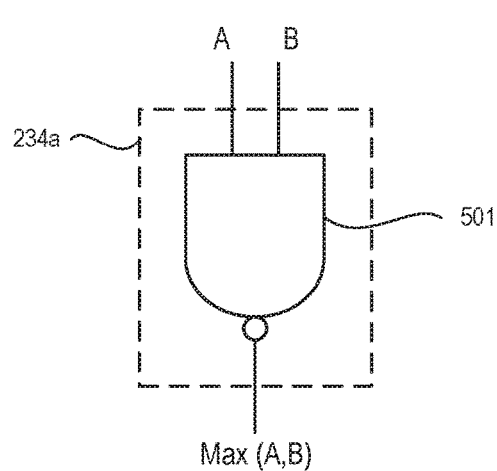
FIGS. 5A-5C illustrates exemplary TOF processing circuits for use with various aspects of the present disclosure.
Figure 5B:
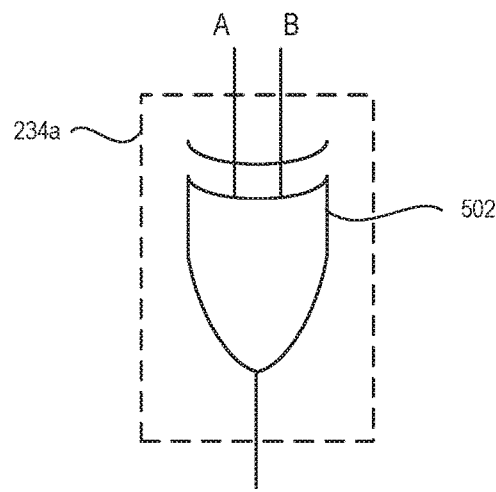
Figure 5C:
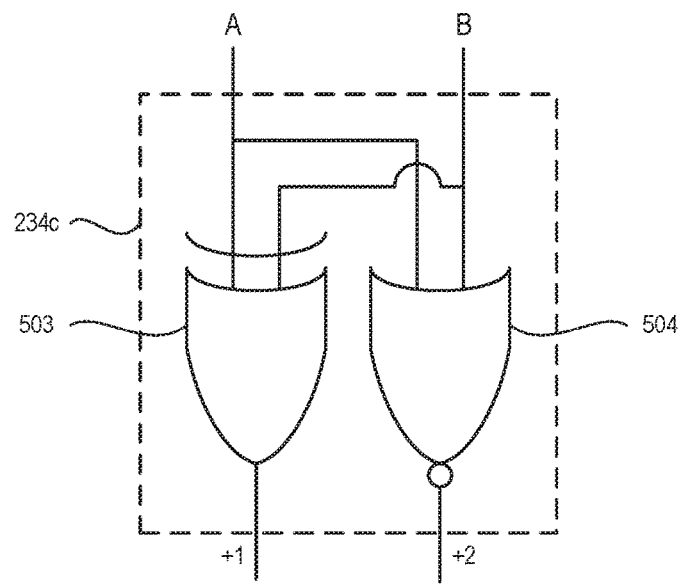

FIGS. 5A-5C illustrate exemplary TOF processing circuits which may generate various output signals illustrated in FIG. 4. As can be seen from FIG. 4, Max(A,B) corresponds to a logical NAND operation performed on the signals A and B. Therefore, as illustrated in FIG. 5A, a TOF processing circuit 234a includes a NAND gate 501 that receives, as inputs, the signals A and B and provides, as an output, the signal Max(A,B). Furthermore, as can be seen from FIG. 4, A−B corresponds to a logical XOR operation performed on the signals A and B. Therefore, as illustrated in FIG. 5B, a TOF processing circuit 234b includes an XOR gate 502 that receives, as inputs, the signals A and B and provides, as an output, the signal A−B.

While the signal A+B does not directly correspond to a single logical operation, it can be represented by a combination of logical operations. In one example, the signal A+B may be generated by a TOF processing circuit 234c as illustrated in FIG. 5C. The TOF processing circuit 234c includes an XOR gate 503 and a NOR gate 504. Both the XOR gate 503 and the NOR gate 504 receive, as inputs, the signals A and B. The output of the XOR gate 503 causes a downstream counter, such as the counter 235 illustrated in FIG. 2, to increment by 1. The output of the NOR gate 504 causes the downstream counter, such as the counter 235 illustrated in FIG. 2, to increment by 2. As a result of the outputs from both the XOR gate 503 and the NOR gate 504, the downstream counter will output a value corresponding to A+B.

Figure 6:
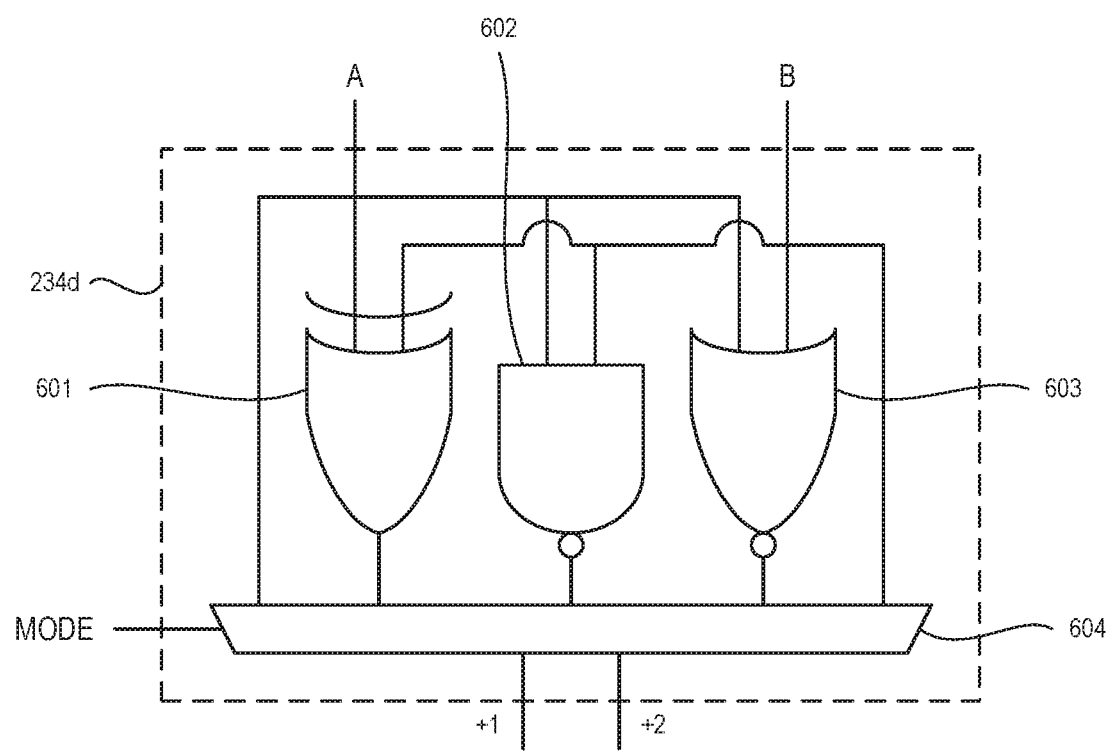
FIG. 6 illustrates an exemplary TOF processing circuit for use with various aspects of the present disclosure.

The operations illustrated in FIGS. 5A-5C may be combined into a single processing circuit. FIG. 6 illustrates an exemplary TOF processing circuit 234d which implements each mode with a single circuit. The TOF processing circuit 234d may be, for example, the TOF processing circuit 234 illustrated in FIG. 2. The TOF processing circuit 234d includes an XOR gate 601, a NAND gate 602, a NOR gate 603, and a multiplexer 604. Each of the XOR gate 601, the NAND gate 602, and the NOR gate 603 receive, as inputs, the signals A and B. The outputs of the XOR gate 601, the NAND gate 602, and the NOR gate 603 are provided to the multiplexer 604. Additionally, the signals A and B are directly provided to the multiplexer 604. In this manner, the multiplexer 604 may select the desired mode in response to a control signal MODE so as to output one of the signals illustrated in FIG. 4 while the comparator, such as the comparator 232, and the counter, such as the counter 235, operate normally.

The mode may be any one of a first tap mode in which the time-of-flight determination signal corresponds to the first tap signal, a second tap mode in which the time-of-flight determination signal corresponds to the second tap signal, a max tap mode in which the time-of-flight determination signal corresponds to the larger of the first tap signal or the second tap signal, a summation tap mode in which the time-of-flight determination signal corresponds to a sum of the first tap signal and the second tap signal, or a difference tap mode in which the time-of-flight determination signal corresponds to a difference of the first tap signal and the second tap signal.

Modification to Imaging System and TOF Processing Circuit

Figure 7:
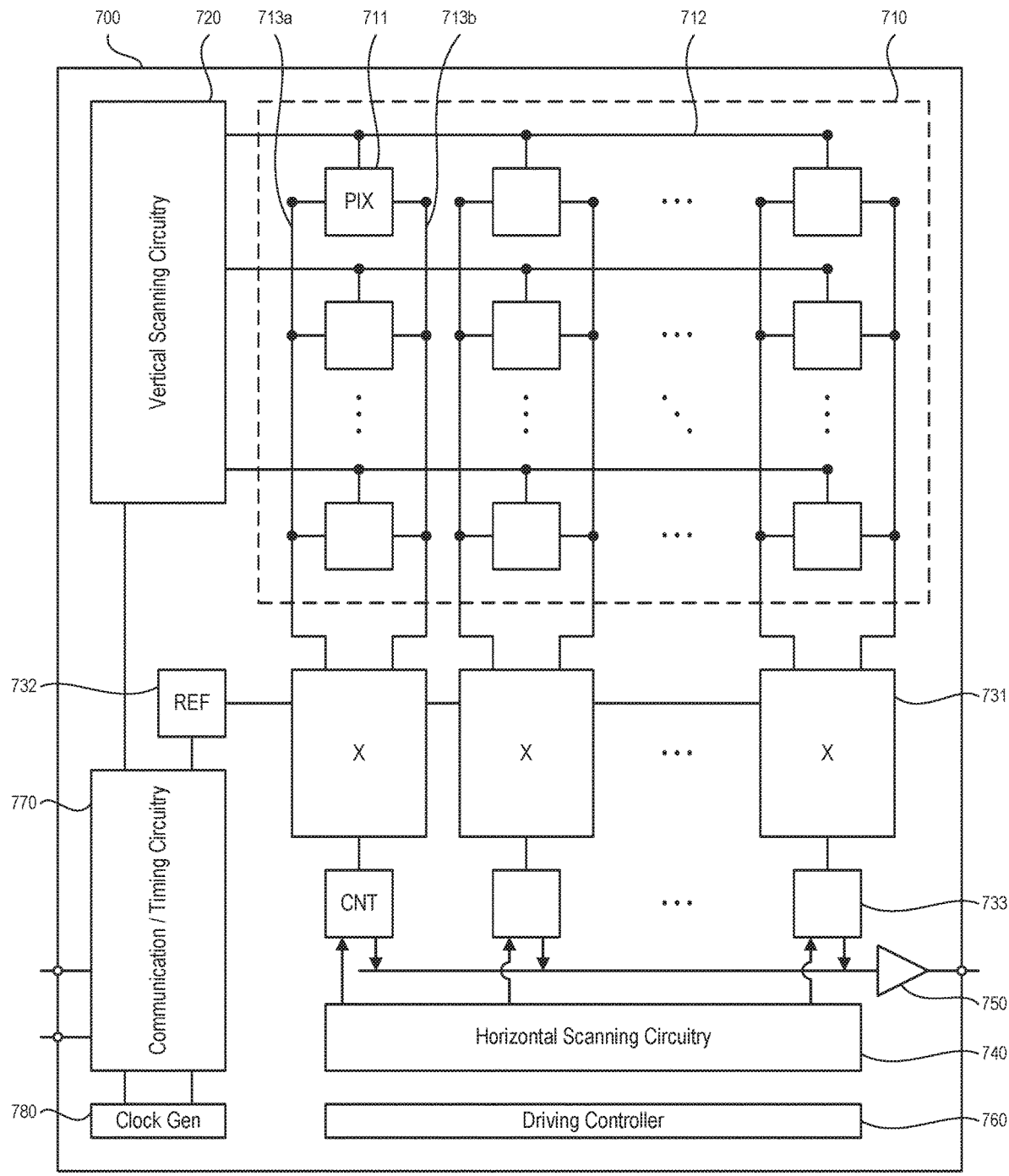
FIG. 7 illustrates an exemplary image sensor according to various aspects of the present disclosure.

While FIGS. 2-6 illustrate an imaging system in which one comparator is provided per tap (such that two comparators are provided per pixel column), it is also possible to implement the above operations using an imaging system in which one comparator is provided for every two taps (such that one comparator is provided per pixel column). FIG. 7 illustrates an exemplary image sensor 700 according to various aspects of the present disclosure which utilizes this principle, and which may be another example of the image sensor 112 illustrated in FIG. 1.

As illustrated in FIG. 7, the image sensor 700 includes an array 710 of pixel circuits 711, each of which are located at an intersection where a horizontal signal line 712 and a pair of vertical signal lines 713a and 713b (also referred to as "taps") cross each other. Each of the pixel circuits 711 may be, for example, the pixel circuit 300 illustrated in FIG. 3. The horizontal signal lines 712 are operatively connected to vertical scanning circuitry 720, also referred to as a "row scanning circuit" or a "vertical driving circuit," at a point outside of the pixel array 710. The horizontal signal lines 712 carry signals from the vertical scanning circuitry 720 to a particular row of the pixel circuits 711. While FIG. 7 illustrates a single horizontal signal line 712 for a given row of the pixel circuits 711, in practice a plurality of the horizontal signal lines 712 may be provided for each row of the pixel circuits 711.

The pixel circuits 711 selectively output an analog signal corresponding to an amount of incident light to the vertical signal lines 713a and 713b in a manner that will be described in more detail below. While FIG. 7 illustrates the vertical signal lines 713a and 713b for a given pixel circuit 711 on opposite sides thereof, in practice the vertical signal lines 713a and 713b may both be provided on a single side of the given pixel circuit 711. Furthermore, for illustration purposes, only a subset of the pixel circuits 710 are actually shown in FIG. 7; however, in practice the image sensor 700 may have any number of the pixel circuits 710. FIG. 7 illustrates two vertical signal lines 713a and 713b for each column of the pixel circuits 711 (a "two-tap" system); however, in practice the image sensor 700 may incorporate a larger number of the vertical signal lines for each column of the pixel circuits 711.

The vertical signal lines 713a and 713b conduct the analog signals (A and B, respectively) for a particular column to a TOF processing circuit 731, which includes a comparator and additional processing circuitry as will be described in more detail below. The TOF processing circuit 731 performs various operations using the signals A and B and a reference signal output from a reference signal generator 732. The reference signal generator 732 may be, for example, a DAC and the reference signal may have, for example, a periodic ramp waveform. The TOF processing circuit 731 outputs a digital signal indicative of the various operations to a counter 733. Compared with other implementations that require a counter for each tap, the image sensor 700 utilizes one counter 733 for each pixel column. Collectively, the TOF processing circuit 731 and the counter 733 may be referred to as a "signal processing circuit." The signal processing circuit may include additional components, such as latches, S/H circuits, and the like. The signal processing circuit may be capable of performing a method of CDS.

Various components of the signal processing circuit are controlled by horizontal scanning circuitry 740, also known as a "column scanning circuit" or "horizontal driving circuit." The horizontal scanning circuitry 740 causes the signal processing circuit to output signals via an output circuit 750 for further processing, storage, transmission, and the like. The vertical scanning circuitry 720, the reference circuit generator 733, and the horizontal circuitry 740 may operate under the control of a driving controller 760 and/or communication and timing circuitry 770, which may in turn operate based on a clock circuit 780. The clock circuit 780 may be a clock generator, which generates one or more clock signals for various components of the image sensor 700. Additionally or alternatively, the clock circuit 780 may be a clock converter, which converts one or more clock signals received from outside the image sensor 700 and provides the converted clock signal(s) to various components of the image sensor 700.

Figure 8:
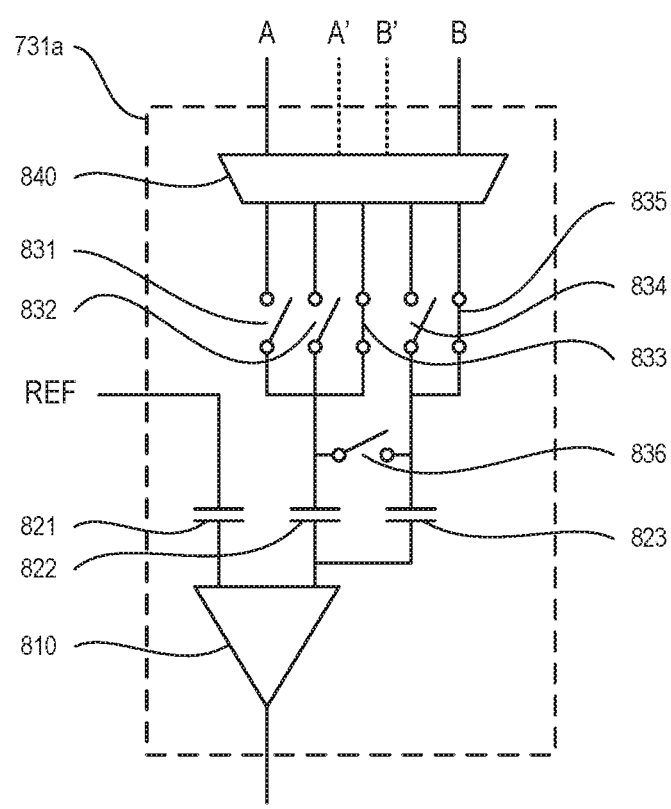
FIG. 8 illustrates an exemplary TOF processing circuit for use with various aspects of the present disclosure.

The image sensor 200 implemented an A+B mode using a combination of single- and double-counting. Alternatively, it is possible to implement the A+B mode based on an averaging of A and B. This alternative implementation may be performed by the image sensor 700. As compared to the image sensor 200, the image sensor 700 may implement an A+B mode using fewer logic circuits. For example, the image sensor 700 may implement A+B by using analog binning capacitors as illustrated in FIG. 8. FIG. 8 illustrates an exemplary TOF processing circuit which may generate the output signal A+B illustrated in FIG. 4. As illustrated in FIG. 8, a TOF processing circuit 731a includes a comparator 810; three capacitors 821, 822, and 823; six switches 831, 832, 833, 834, 835, and 836; and a multiplexer 840. The comparator 810 receives a reference signal REF (for example, from the reference signal generator 733 illustrated in FIG. 7) at one input thereof, and receives a second signal based on the states of the switches 831, 832, 833, 834, 835, and 836 at the other input thereof. The respective signals are provided to the comparator 810 via the capacitors 821, 822, and 823. The capacitors 822 and 823 may have a respective capacitance value that is one-half a capacitance value of the capacitor 821. The multiplexer 840 receives the signals A and B, and may be selectively provided with additional signals A' and B'. For example, using an adjacent-pixel binning mode, the signal A' may correspond to the A tap of an adjacent pixel column and the signal B' may correspond to the B tap of the adjacent pixel column. The switch 836 controls whether the TOF processing circuit 731a is in the adjacent-pixel binning mode. The switches 831, 832, 833, 834, and 835 control whether the TOF processing circuit 731a is performing the A+B operation or is in a normal mode. More or fewer switches may be provided. For example, only two of the switches 831, 832, and 833 may be necessary.

Figure 9A:
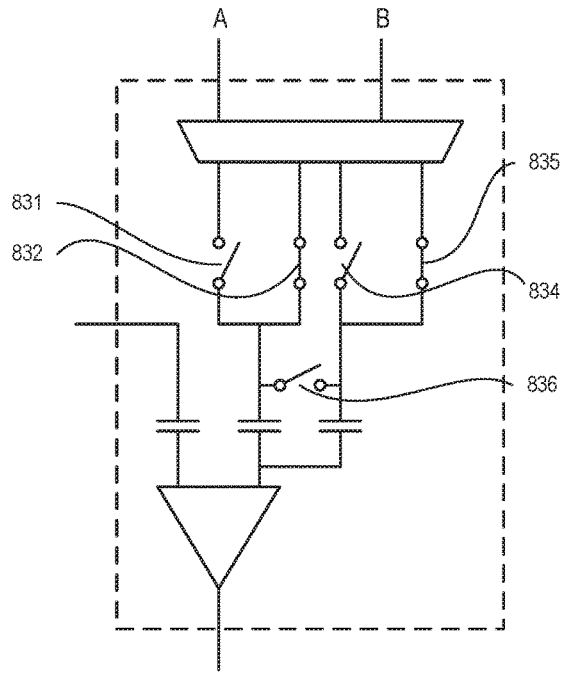
FIGS. 9A-9C illustrate exemplary modes for the TOF processing circuit according to FIG. 8.
Figure 9B:
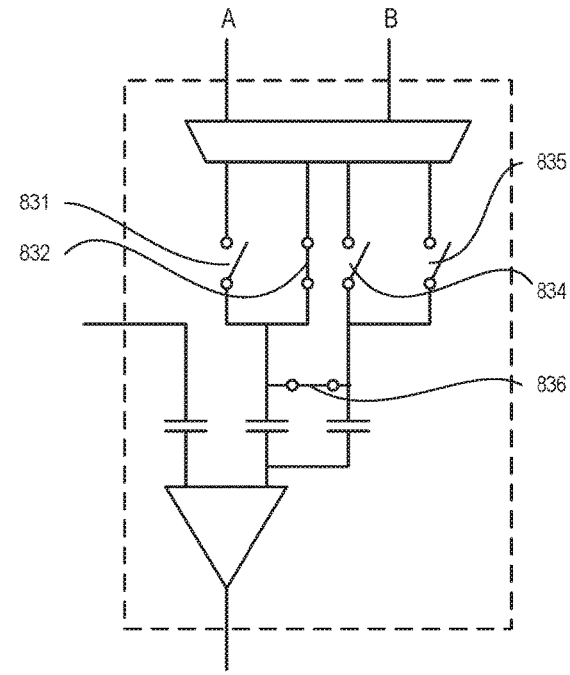
Figure 9C:
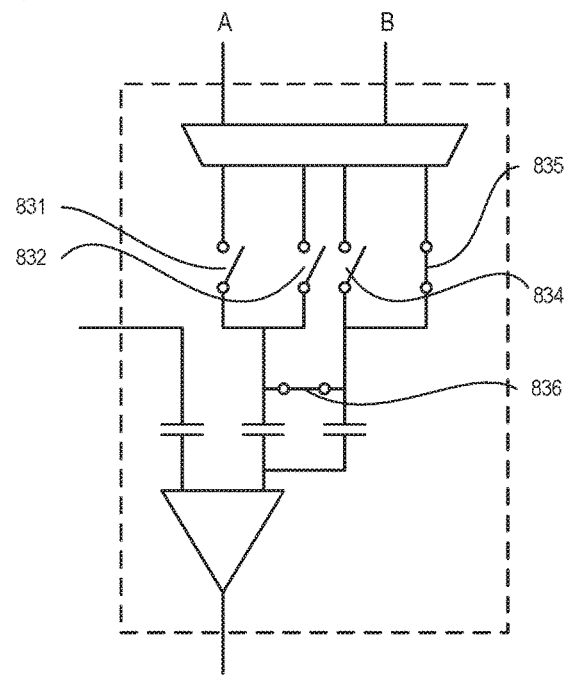

FIGS. 9A-9C illustrate various modes of the TOF processing circuit 731a. FIG. 9A illustrates an averaging mode, such that the TOF processing circuit 731a outputs a signal (A+B)/2. The signal A+B may be generated downstream; for example, by multiplying the averaging signal by 2 in the digital domain. In the averaging mode, the switches 831 and 834 are open while the switches 832, 835, and 836 are closed. FIG. 9B illustrates a "Read A" mode, such that the TOF processing circuit 731a outputs the signal A. In the Read A mode, the switches 831, 834, and 835 are open while the switches 832 and 836 are closed. FIG. 9C illustrates a "Read B" mode, such that the TOF processing circuit 731a outputs the signal B. In the Read B mode, the switches 831, 832, and 834 are open while the switches 835 and 836 are closed.

Figure 10:
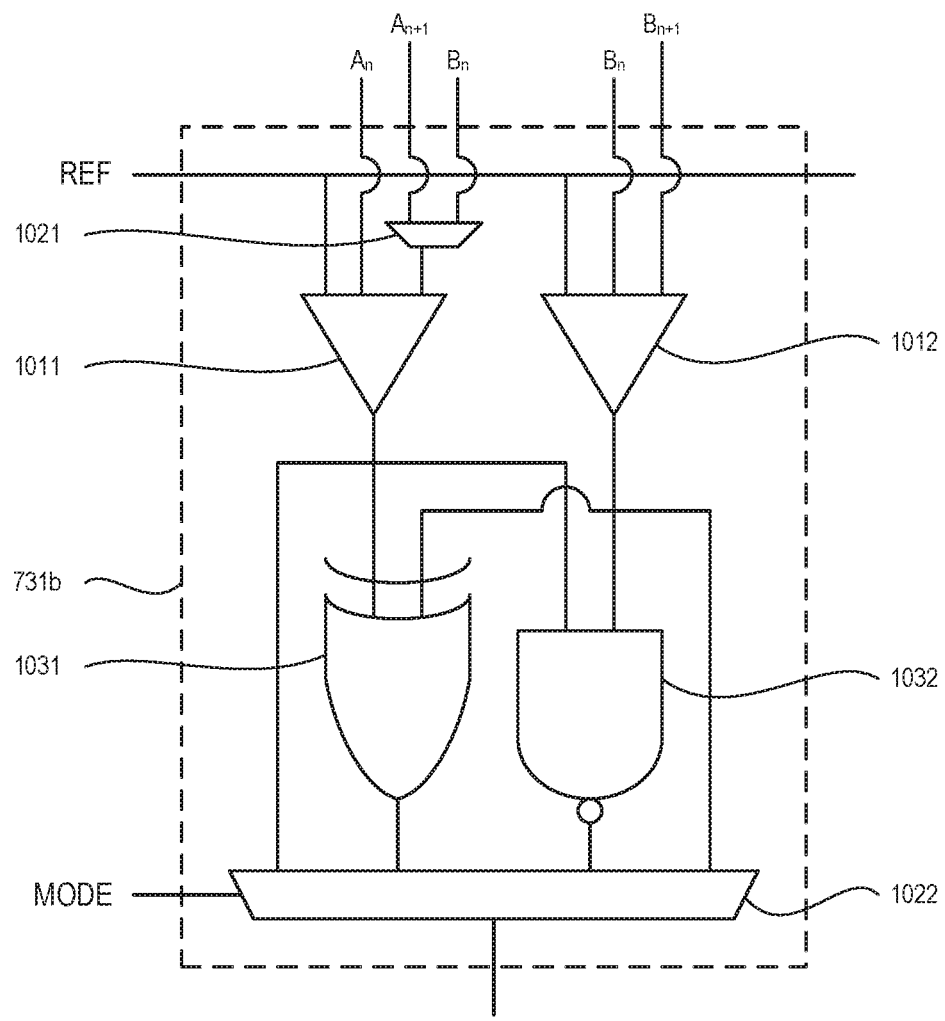
FIG. 10 illustrates an exemplary TOF processing circuit for use with various aspects of the present disclosure.

The averaging-based A+B mode may be implemented along with an A−B mode and a Max(A,B) mode using a single processing circuit. FIG. 10 illustrates an exemplary TOF processing circuit 731b which implements each mode with a single circuit. The TOF processing circuit 731b may be, for example, the TOF processing circuit 731 illustrated in FIG. 7. The TOF processing circuit 731b includes a first comparator 1011, a second comparator 1012, a first multiplexer 1021, a second multiplexer 1022, an XOR gate 1031, and a NAND gate 1031. For clarity of illustration, some elements, such as the switches and capacitors illustrated in FIG. 8, are not illustrated in FIG. 10. Because the image sensor 700 implements one comparator for each pixel column (as opposed to the image sensor 200, which implements one comparator for each tap), the TOF processing circuit 731b may be provided for two adjacent pixel columns.

The first comparator 1011 receives the reference signal REF (for example, from the reference signal generator 733 illustrated in FIG. 7) at one input, receives the signal A from an n column of the pixel array at another input, and selectively receives the signal B from the column of the pixel array or the signal A from an adjacent (n+1) column of the pixel array based on the output of the first multiplexer 1021. Depending on the states of the various switches (not shown) and the first multiplexer 1021, the first comparator 1011 outputs a signal corresponding to A or A+B. The second comparator 1012 receives the reference signal REF and the signals B from both the n column and the n+1 column of the pixel array. The output of the first comparator 1011 is provided to one input of both the XOR gate 1031 and the NAND gate 1032, as well as directly to the second multiplexer 1022. The output of the second comparator 1012 is provided to the other input of both the XOR gate 1031 and the NAND gate 1032, as well as directly to the second multiplexer 1022. In this manner, the second multiplexer 1022 may select the desired mode in response to a control signal MODE so as to output one of the signals illustrated in FIG. 4.

The mode may be any one of a first tap mode in which the time-of-flight determination signal corresponds to the first tap signal, a second tap mode in which the time-of-flight determination signal corresponds to the second tap signal, a max tap mode in which the time-of-flight determination signal corresponds to the larger of the first tap signal or the second tap signal, a summation tap mode in which the time-of-flight determination signal corresponds to a sum of the first tap signal and the second tap signal, or a difference tap mode in which the time-of-flight determination signal corresponds to a difference of the first tap signal and the second tap signal.

Conclusion

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A time-of-flight sensor, comprising:
a pixel array including a plurality of pixel circuits, respective ones of the plurality of pixel circuits including a first tap and a second tap; and
a signal processing circuit including
a first comparator configured to output a first signal based on an output from the first tap,
a second comparator configured to output a second signal based on an output from the second tap,
a logic circuit configured to perform at least one logical operation on the first signal and the second signal, and to output a third signal based on the at least one logical operation, and
a counter configured to output a fourth signal based on the third signal, the first comparator, the second comparator, the logic circuit and the counter respectively corresponding to a column of the plurality of pixel circuits in the pixel array.

2. The time-of-flight sensor according to claim 1, wherein the fourth signal is a digital signal.

3. The time-of-flight sensor according to claim 1, wherein the at least one logic operation includes a NAND operation.

4. The time-of-flight sensor according to claim 1, wherein the at least one logic operation includes an XOR operation.

5. The time-of-flight sensor according to claim 1, wherein the at least one logic operation includes a NOR operation.

6. The time-of-flight sensor according to claim 1, wherein the at least one logic operation includes a NOR operation and an XOR operation.

7. The time-of-flight sensor according to claim 1, wherein the at least one logic operation includes a NAND operation, a NOR operation, and an XOR operation.

8. A time-of-flight system, comprising:
   a light source configured to emit a light; and
   a sensor comprising
      a pixel array including a plurality of pixel circuits, respective ones of the plurality of pixel circuits including a first tap and a second tap, and
      a signal processing circuit including
         a first comparator configured to output a first signal based on an output from the first tap,
         a second comparator configured to output a second signal based on an output from the second tap,
         a logic circuit configured to perform at least one logical operation on the first signal and the second signal, and to output a third signal based on the at least one logical operation, and
         a counter configured to output a fourth signal based on the third signal,
         the first comparator, the second comparator, the logic circuit and the counter respectively corresponding to a column of the plurality of pixel circuits in the pixel array.

9. The time-of-flight system according to claim 8, comprising:
   a processor configured to output a distance information signal based on the fourth signal.

10. The time-of-flight system according to claim 8, wherein the light has a wavelength corresponding to an infrared range.

11. The time-of-flight system according to claim 8, wherein the respective ones of the plurality of pixel circuits include a photodiode, the output of the first tap and the output of the second tap corresponding to an output of the photodiode.

12. The time-of-flight sensor according to claim 1, wherein the respective ones of the plurality of pixel circuits include a photodiode, the output of the first tap and the output of the second tap corresponding to an output of the photodiode.

* * * * *